United States Patent [19]
Cullman et al.

[11] Patent Number: 6,016,185
[45] Date of Patent: Jan. 18, 2000

[54] LENS ARRAY PHOTOLITHOGRAPHY

[75] Inventors: Elmar Cullman, Groebenzel, Germany; Reinhard Völkel, Neuchatel, Switzerland; Karin M. Wells, Mountain View, Calif.

[73] Assignee: Hugle Lithography, Sunnyvale, Calif.

[21] Appl. No.: 08/956,329

[22] Filed: Oct. 23, 1997

[51] Int. Cl.⁷ .............................. G03B 27/68; G03B 27/42
[52] U.S. Cl. ................................. 355/52; 355/53
[58] Field of Search .................... 355/52, 53, 67, 355/71, 77, 54; 359/197, 210; 250/548, 492.2

[56] References Cited

U.S. PATENT DOCUMENTS

| | | | |
|---|---|---|---|
| 3,610,752 | 10/1971 | Wilson | 355/77 |
| 4,023,126 | 5/1977 | Schlafer | 355/51 |
| 4,474,459 | 10/1984 | Tokumaru | 355/46 |
| 4,621,892 | 11/1986 | Kataoka | 350/6.3 |
| 4,640,573 | 2/1987 | Kataoka et al. | 350/6.1 |
| 4,851,882 | 7/1989 | Takahashi et al. | 355/46 |
| 5,153,437 | 10/1992 | Nishii et al. | 250/231.14 |
| 5,337,097 | 8/1994 | Suzuki et al. | 353/101 |
| 5,517,279 | 5/1996 | Hugle et al. | 355/46 |
| 5,546,139 | 8/1996 | Bacs, Jr. et al. | 348/754 |
| 5,661,546 | 8/1997 | Taniguchi et al. | 355/53 |
| 5,686,960 | 11/1997 | Sussman et al. | 348/218 |
| 5,742,376 | 4/1998 | Makinouchi | 355/53 |

FOREIGN PATENT DOCUMENTS

| | | |
|---|---|---|
| 0 744 641 A2 | 11/1996 | European Pat. Off. . |
| WO 97/34171 | 9/1997 | WIPO . |

OTHER PUBLICATIONS

Volkel et al., "Microlens array imaging system for photolithography," Opt. Eng. vol. 35, No. 11, Nov. 1996, pp. 3323–3330.

*Primary Examiner*—Safet Metjahic
*Assistant Examiner*—Hung Henry Nguyen
*Attorney, Agent, or Firm*—Fish & Richardson P.C.

[57] ABSTRACT

An apparatus and method for photolithographic exposure of a substrate including an illumination source for providing light for producing an image on the substrate, a mask including a pattern for projection onto the substrate, a lens assembly for projecting the light through a plurality of lens channels onto the substrate and an actuator for moving the lens assembly in a plane parallel to the mask and the substrate for suppressing interference effects.

18 Claims, 20 Drawing Sheets

Figure 5a        Figure 5b

| Relation of lens diameter $\varnothing$ and lens pitch $p_x$ | fill factor $\eta$ in [%] | |
|---|---|---|
| | rectangular $p_x = p_y$ | hexagonal $p_y = \frac{\sqrt{3}}{2} p_x$ |
| $\varnothing = p_x$ | 78.5 | 90.7 |
| $\varnothing = 0.99 \cdot p_x$ | 77.0 | 88.9 |
| $\varnothing = 0.98 \cdot p_x$ | 75.4 | 87.1 |
| $\varnothing = 0.97 \cdot p_x$ | 73.9 | 85.3 |
| $\varnothing = 0.95 \cdot p_x$ | 70.9 | 81.9 |
| $\varnothing = 0.9 \cdot p_x$ | 63.6 | 73.5 |

LENS ARRAY PHOTOLITHOGRAPHY

BACKGROUND

This invention relates to microimaging and more specifically to photolithography using lens arrays.

Projection of microimages is common for the manufacturing processes of microdevices including both electric and mechanical microdevices. These include, but are not limited to: electronic type devices such as micro integrated circuits, flat panel display devices, liquid crystal display devices, plasma display devices and field emission display devices; and, and physical devices such as surface acoustic wave devices, micromotors and other micromechanical devices.

Modern microlithography processes sometimes require projection of light images having features as small as, or even smaller than one micrometer ($\mu$m). Images for microlithography applications having such small features are generally produced with large lenses in photolithography projection machines. It is a necessary result of physics that the smaller the features of an image, the larger the lens required to faithfully reproduce those small features. However, many problems arise as lens size increase including lens aberrations, thermal stability issues, limited field-of-view, and uniformity issues.

A popular exposure tool for projecting images for photolithographic applications is called a stepper machine. A stepper machine generally includes a very precise large lens with a high numeric aperture. Some stepper machines are capable of faithfully reproducing images with features as small as 0.5 microns. Aberrations limit the useful field-of-view of stepper machines to a circular area of a few centimeters in diameter.

Many devices, although being comprised of very tiny elements, necessarily extend over several centimeters in their entirety. For example, a flat panel display (FPD) device may be fifty centimeters on a side being made up of millions of individual pixels that are only fifty microns on a side. To manufacture devices that require images larger than the maximum field size of a given stepper machine, several stepper image fields are projected in sequential exposures immediately next to each other. This method requires a displacement of the stepper lens with respect to the device substrate that is being printed, and therefore requires very sophisticated motion and alignment equipment. The exposure steps and move steps are repeated until the entire surface of a device substrate is exposed. In this way, a large area device can be "built-up" with a multiplicity of exposures of a single, area-limited stepper field.

It is very difficult to align two stepper fields together. The alignment accuracy is sometimes required to be a small fraction of the image feature size; as small as 100 nanometers. Even with perfect alignment, adjacent images do not always "communicate" well with each other. This is mainly due to third order aberrations such as "pincushion" distortion. Pincushion distortion gets worse as a function of the cube of the radius of an image point as measured from the lens axis in the image plane. These aberrations occur over the entire field area as geometric image placement errors which further complicate alignment of one field to an adjacent field.

Because the field size of a stepper exposure machine is limited, and the alignment of one field to an adjacent field is extremely difficult, it necessarily takes a long time for devices requiring large area exposures to be built-up from a multiplicity of smaller sub-fields. The time that it takes to perform the process limits the amount of devices that a given machine can produce. This limit is expressed as system "throughput" and a primary disadvantage of stepper machines is their low throughput.

It is a further problem in the manufacture of flat panel displays to realize high yield. Sometimes during the manufacture of a device flaws occur that can have a catastrophic effect on the performance of the device. A single error caused by field misalignment, which is common in stepping methods, can cause an entire device to be useless. Nevertheless, the "step-and-repeat" method is the preferred microlithography method for producing large devices like FPDs. The use of stepper machines results in unacceptably low throughput and yield problems.

Another well known method of photolithography for very large areas is called "contact printing". Contact printing requires printing using a photomask which is maintained in very close proximity to the substrate being printed. While contact printing does not suffer from field size limitations, contact printing has an extensive contamination problem. Contamination (or other damage) results from contact between the photomask and the substrate necessitating the frequent and costly replacement of the photomask. Contact printing therefore is not considered a desirable alternative.

SUMMARY OF THE INVENTION

In general, in one aspect, the invention features a micro-optical imaging system including two consecutive micro-objectives providing a 1:1 imaging of an object pattern. Each micro-objective consists of one or more microlenses and on or more stop arrays (serving as aperture stops, field stops, telocentric stops or the like). An intermediate image of the object is located between the micro-objectives in the image plane. The intermediate image may be inverted and of the same size as the object image or demagnified. The imaging system may be used in both directions for printing (in the forward direction) and aligning of a wafer to a mask (the backward direction). The imaging system may be moved laterally (in the x, y plane for a vertical imaging system) to average interference effects and to homogenize the intensity in the image plane.

In one aspect, the invention includes an apparatus for photolithographic exposure of a substrate including an illumination source for providing light for producing an image on the substrate, a mask including a pattern for projection onto the substrate, a lens assembly for projecting the light through a plurality of lens channels onto the substrate and an actuator for moving the lens assembly in a plane parallel to the mask and the substrate for suppressing interference effects.

Aspects of the invention include the following features. The actuator moves the lens assembly along a first motion path that defines a circle. The circle has a radius of a few lens diameters. The actuator moves the lens assembly along a second motion path while generally traversing the first motion path. The second motion path defines a second circle of a smaller radius.

The lens assembly includes a plurality of tiles. The tiles are arranged to form a patterned sheet. The patterned sheet includes joint regions disposed between tiles. The patterned sheet is scanned to eliminate defects associated with an individual tile or joint region. The patterned sheet is moved relative to the substrate to eliminate defects associated with an individual tile or joint region.

The lens assembly includes bi-directional lens channels for projecting an image from a surface of the substrate back to a surface of the mask to align the mask and substrate.

The light is poly-chromatic light. Components of the poly-chromatic light produce images at different depths in the substrate.

In another aspect, the invention provides an apparatus for photolithographic exposure of a substrate including an illumination source for providing light for producing an image on the substrate, a mask including a pattern for projection onto the substrate, a lens assembly for projecting the light through a plurality of lens channels onto the substrate and a scanning mirror for reflecting light from the illumination source onto a portion of a surface of the substrate. The scanning mirror is operable to move parallel to the imaging surface to allow for the illumination of the entire substrate surface.

Aspects of the invention include the following features. The lens assembly is attached to the scanning mirror such that as a combination of the lens assembly and scanning mirror are moved, interference effects are averaged. The lens assembly is sized at least as big as the substrate and fixed with the mask.

In another aspect, the invention provides a method of suppressing interference effects and averaging lens array defects in a photolithography exposure of a substrate. The method includes providing a lens array including a plurality of lens channels for projecting an image from a mask onto the substrate and moving the lens array relative to the substrate along a first path such that every location on the substrate is imaged by two or more lens channels in the lens array during the photolithography process.

Comes now, an invention including novel methods of and devices for photolithography exposure to relieve problems heretofore not solvable by conventional methods and devices.

Methods of the invention are expected to improve throughput and manufacturing yield; the most serious limitations of large area microdevice manufacture. In addition, lens arrays can be adapted to correct for defects in the lens array to allow for improved image quality at the image plane.

BRIEF DESCRIPTION OF THE DRAWINGS

The features mentioned in the summary of the invention and other features, aspects, and advantages of the present invention will become better understood with regard to the following description, appended claims and drawings where:

FIGS. 5a–b show two alternative arrangements of lens elements in a micro-objective assembly according to the invention.

DETAILED DESCRIPTION OF THE INVENTION

In accordance with each of the preferred embodiments of the invention, there is provided an apparatus for and method of photolithographic exposure. It will be appreciated that each of the embodiments described include both an apparatus and method and that the apparatus and method of one preferred embodiment may be different than the apparatus and method of another embodiment. The invention may be used in conjunction with various photolithographic tools including steppers, proximity printers and proximity maskaligners. A description is provided with respect to a proximity printer.

Figure 1:
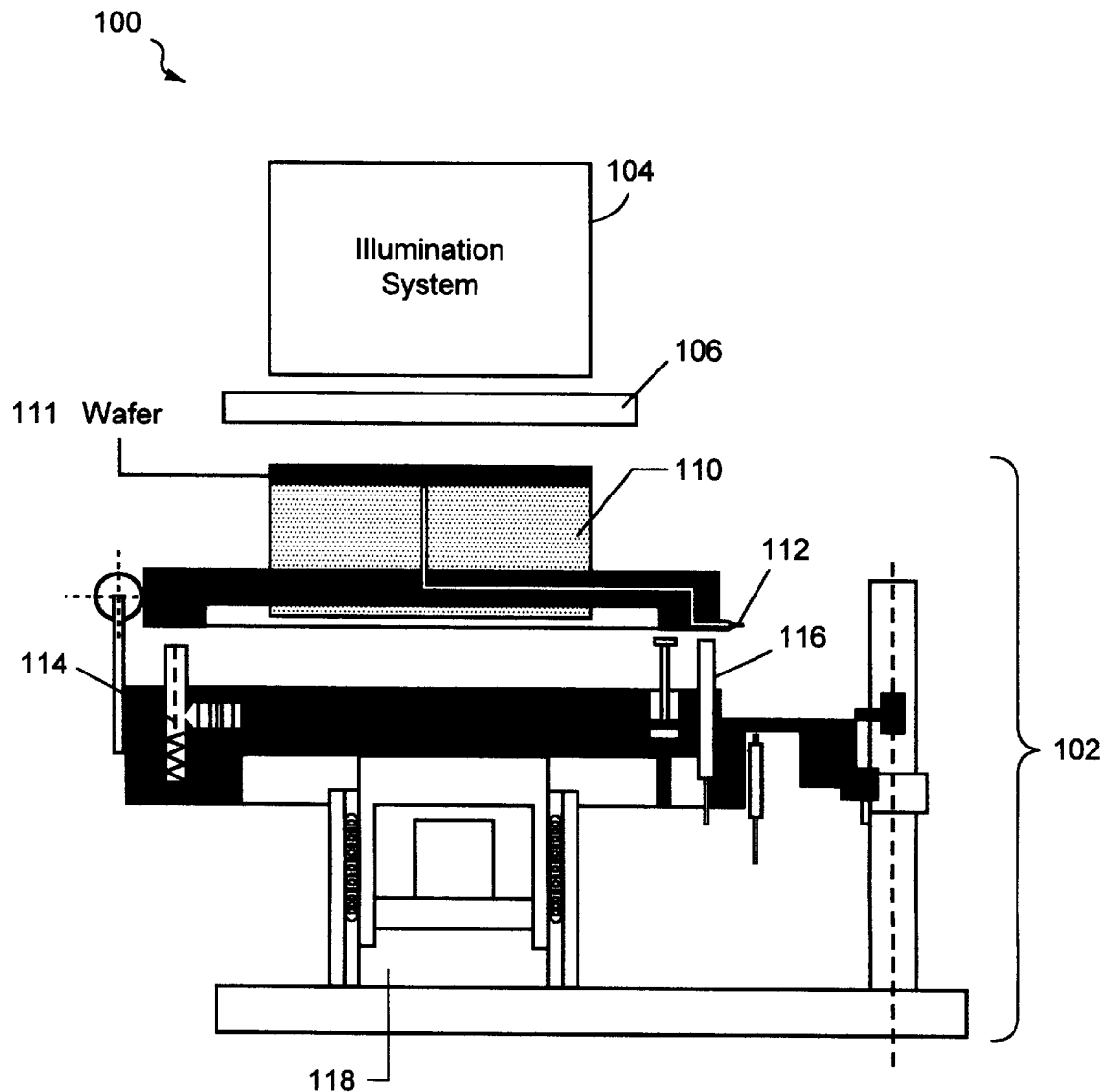
FIG. 1 is a schematic block diagram of a photolithography device according to the invention.

Referring now to FIG. 1, a machine 100 for photolithography includes substrate handling system 102, alignment mechanisms (not shown) and an illumination system 104 including a light source (shown in FIG. 2), a micro-objective assembly (shown in FIG. 2.) and a photomask 106.

Handling system 102 includes a chuck 110, pneumatic and vacuum plumbing 112, pistons 114 and step motor 118. Chuck 110 provides a platform for supporting a substrate 111 (e.g. wafer) to be imaged. Pneumatic and vacuum plumbing 112 provide a path through chuck 110 for allowing the application of a vacuum by an external evacuating source (not shown) to the bottom of a substrate to maintain substrate 111 on chuck 110. Pistons 114 are pneumatically clamped and hold chuck 110 and substrate 111 parallel to illumination system 104 (particularly, the micro-objective assembly).

Alignment of substrate 111 relative to illumination system 104 and photomask 106 is discussed in greater detail below in conjunction with FIG. 9.

Exposure Tool

An illumination system is required to provide an illumination of photomask 106 onto substrate 111. The type of illumination source selected has an impact on the image quality produced on the substrate.

Figure 2:
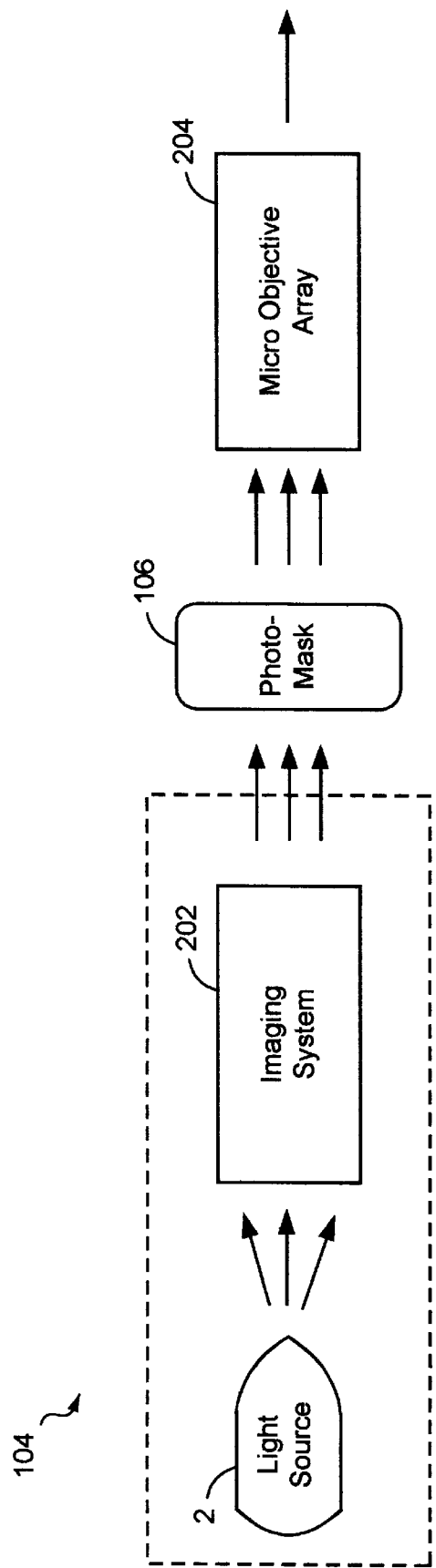
FIG. 2 is a schematic block diagram of an exposure tool according to the invention.
Figure 3:
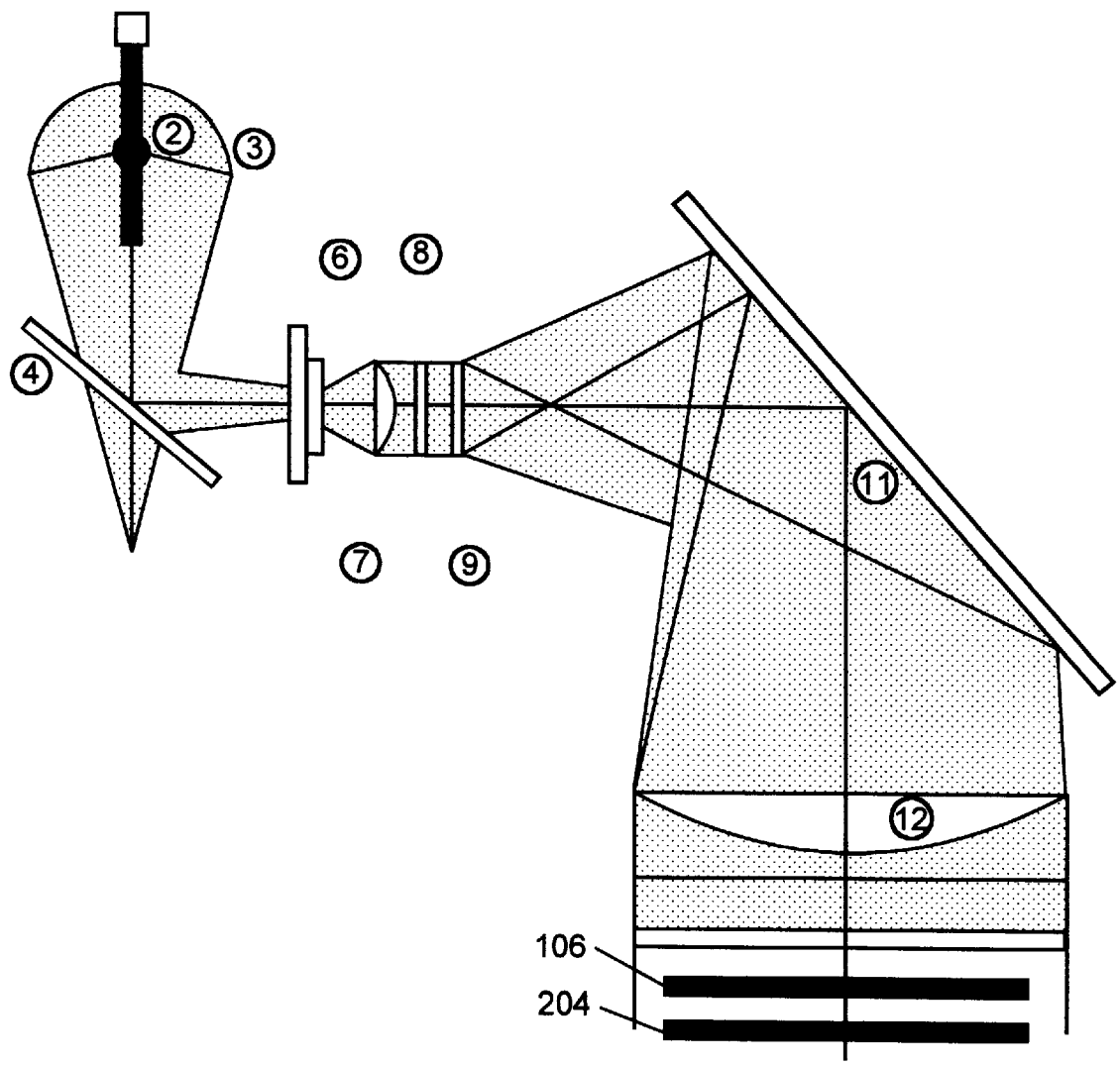
FIG. 3 is a detailed schematic block diagram of the exposure tool of FIG. 2 according to the invention.
Figure 4A:
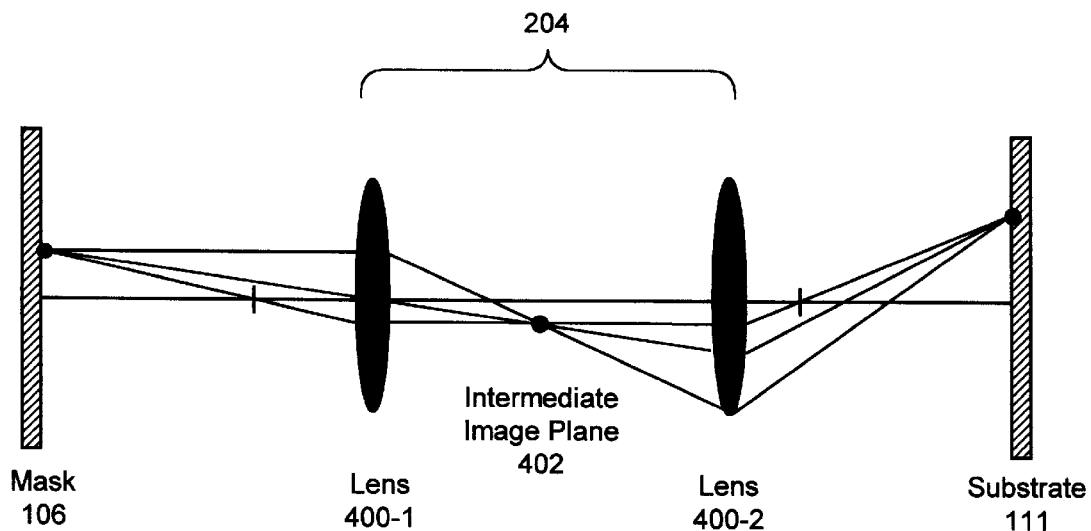
FIGS. 4a–d show four alternative arrangements of a micro-objective assembly according to the invention.
Figure 4B:
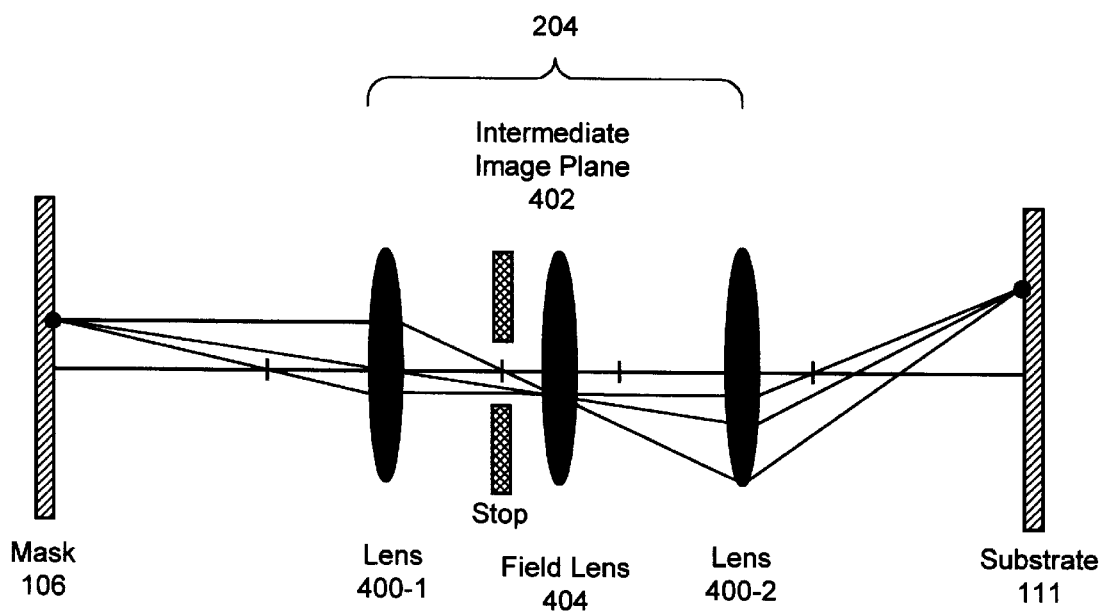
Figure 4C:
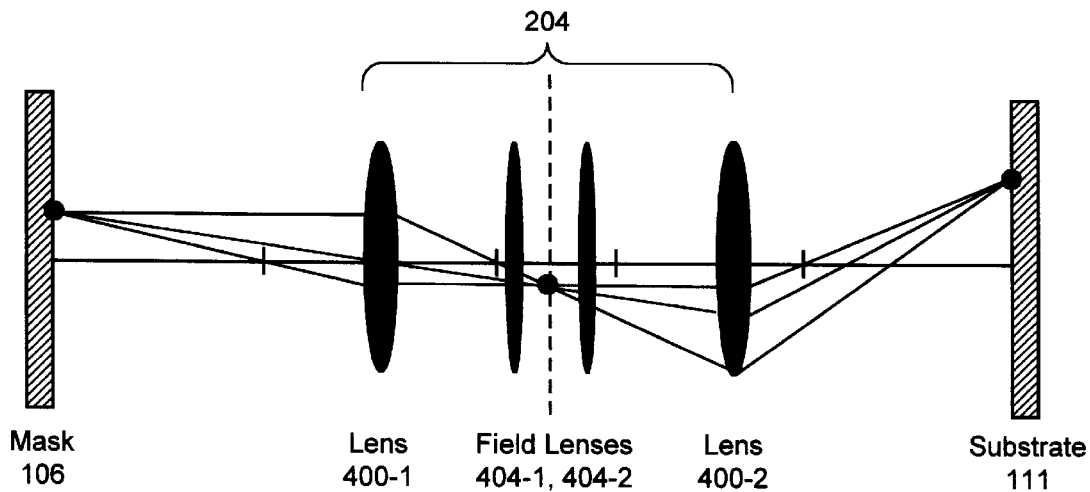
Figure 4D:
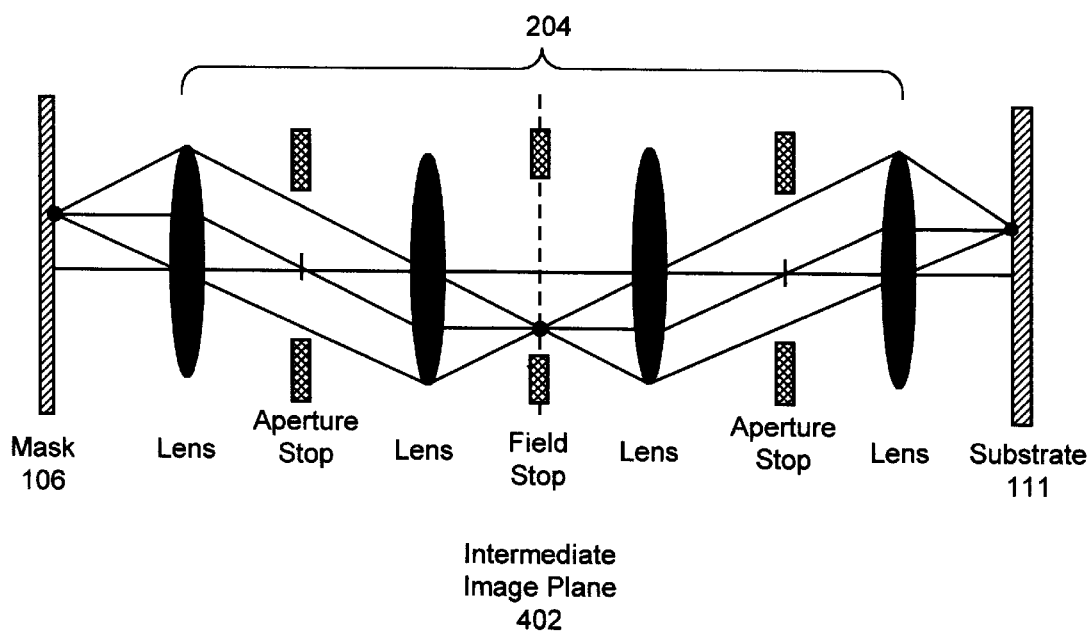
Figure 5C:
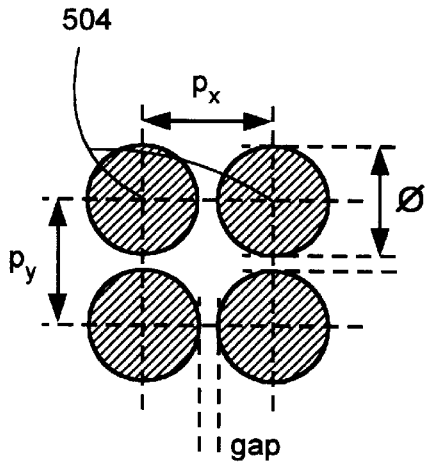
FIG. 5c shows a table for geometries for the arrangements shown in FIGS. 5a and 5b.
Figure 5C:
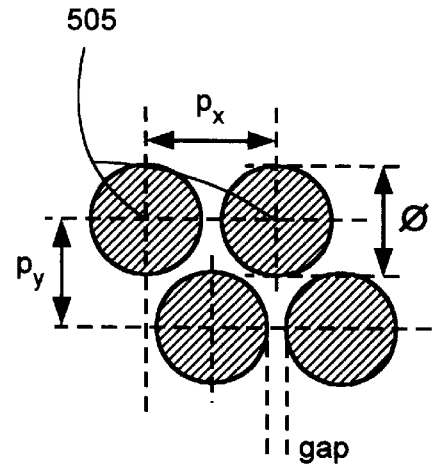

Referring now to FIGS. 2 and 3, one example of an optical arrangement for illumination system 104 includes a light source 2, imaging system 202, photomask 106, and micro-objective assembly 204. Light source 2 may be a short-arc lamp or an excimer laser.

The light from light source 2 may be collected by an ellipsoidal mirror 3. The actinic portion of the spectrum of the collected light is reflected off ellipsoidal mirror 3 by a cold light mirror 4, homogenized by diffuser 6, collimated by a first collimation lens 7 and delivered to a pair of lens plates 8 and 9. Lens plates 8 and 9 may hold a plurality of lenses (not shown), the number of which (typically between 7 and 20) may be adjusted in order to control the collimation angle, the number of illumination beams and the geometrical relationship of the beams provided to turning mirror 11. The different beams are then collimated with a second collimation lens 12. The light of the different beams is superimposed in the mask plane, resulting in the illumination of photomask 106.

Photomask

Photomask 106 may contain an amplitude pattern, a phase pattern or a combination of both. Photomask 106 modifies the distribution of incident light. The light may be either reflected, absorbed, scattered, diffracted, transmitted through the photomask unchanged. Beyond photomask 106, light distributed by photomask 106 travels in free space until it arrives at micro-objective assembly 204.

Photomask 106 is a light mask with aperture stops and apertures that serve to convert a uniform light field to a spatially patterned light field. Photomask 106 may be a substantially flat glass substrate with a pattern of chromium evaporated thereon. The pattern of chromium defines the micro-objective (circuitry or other structure) to transmitted to the substrate in the photolithographic process. Alternatively, photomask 106 may be a phase shift mask that includes stops and apertures of various types where the phase of a light field wavefront passing through some of the apertures in the photomask are shifted, usually by a high index transparent material.

Micro-objective Assembly

Referring now to FIGS. 4a–4d, micro-objective assembly 204 may be used in a large area tool and thus be of the form of a continuous sheet sized to cover the entire mask/print area. Other configurations of the micro-objective assembly 204 including tiling and scanning systems are discussed in greater detail below with reference to FIGS. 13 and 14. For the purposes of these discussions, the size of the sheet is immaterial, and accordingly attention is focused instead on the structure of the assembly. Micro-objective assembly 204 may be a single lens or include a plurality of lenses 400-1 and 400-2 in a symmetrical assembly relative to an intermediate image plane 402. Photomask 106 is imaged by lens 400-1 to intermediate image plane 402 and by a second lens 400-2 onto substrate 111. Lens 400-1 may be a single microlens or a combination of two or more microlenses forming an objective. A symmetrical lens system is employed to minimize any asymmetrical wavefront aberrations including coma, distortion and lateral color.

One or more field lenses 404 may be arranged symmetrically relative to the intermediate image plane 402 and between lenses 400-1 and 400-2. A field lens placed between lenses 400 in the micro-objective assembly assures that all light rays passing the exit pupil of lens 400-1 hit the entrance of lens 400-2. One or more apertures or stop arrays 406 may be added to limit the passage of energy through the system and avoid crosstalk between adjacent imaging channels.

Each lens includes a plurality of micro-objective channels (hereinafter "channels"). Each channel transports the incident light through the micro-objective assembly and projects the light into the image plane, where the substrate is located. The light emerging from one point on photomask 106 is transported by one or more micro-objective channels in parallel. All rays from one mask point are imaged onto one point in the image plane.

Lenses 400 and 404 may be spherical or aspherical plano-convex refractive lenses or combinations thereof. Lenses 400 and 404 may be other micro-optical elements like bi-convex, concave, meniscus, or other refractive, diffractive, gradient index or hybrid lenses, prisms, gratings or phase shift elements. A combination of diffractive and refractive optics may be used to correct chromatic aberration. Each lens 400 may include both diffractive and refractive optics produced on opposites sides of a given lens (substrate).

An array of lens channels can be embodied in several ways to meet various repetitive properties. The four drawings of FIGS. 5a, 5b, 6 and 7 show how the lens channels can be configured on centers 504 and 505 that define a rectangular (FIG. 5a) or a triangular (FIG. 5b, 6, and 7) repetitive pattern referred to as a hexagonal packed pattern.

Figure 7:
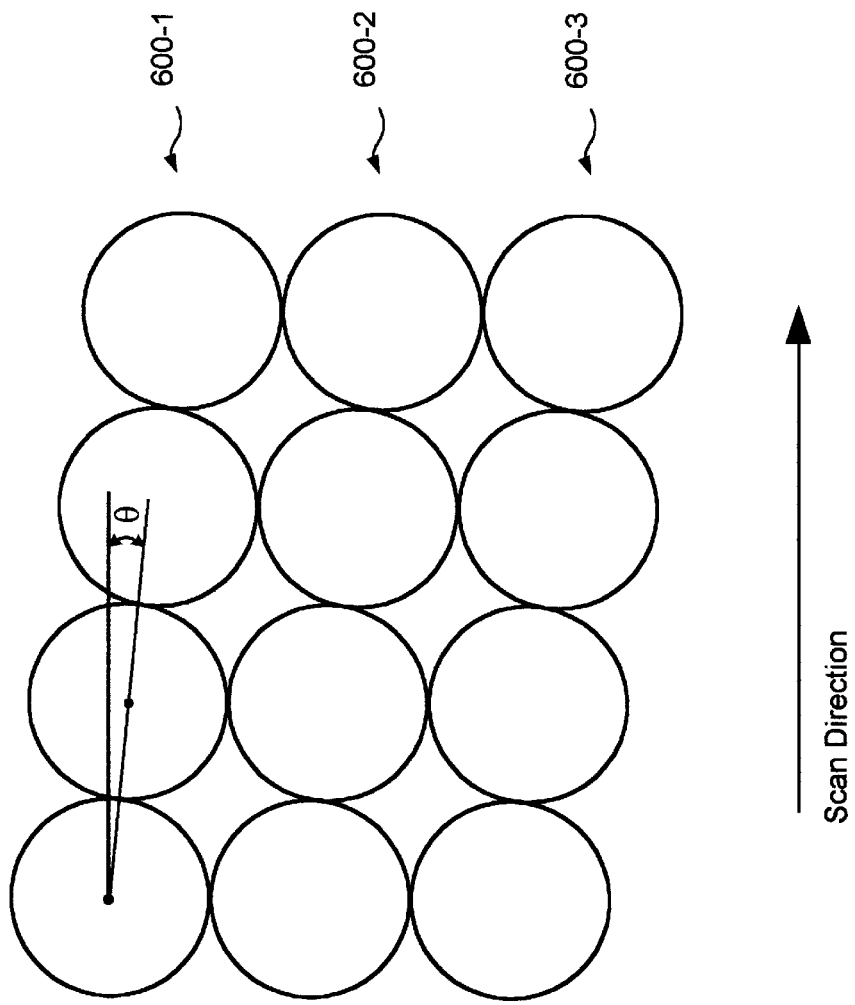
FIG. 7 shows an alternative lens arrangement according to the invention.
Figure 6:
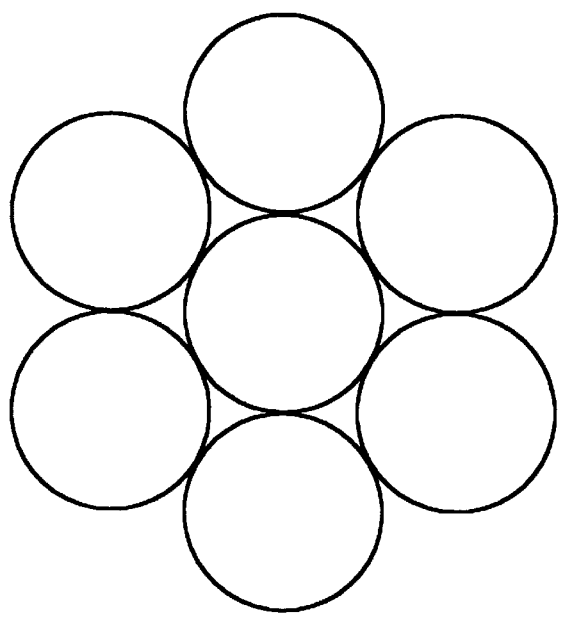
FIG. 6 shows a hexagonal packed lens arrangement according to the invention.
Figure 11A:
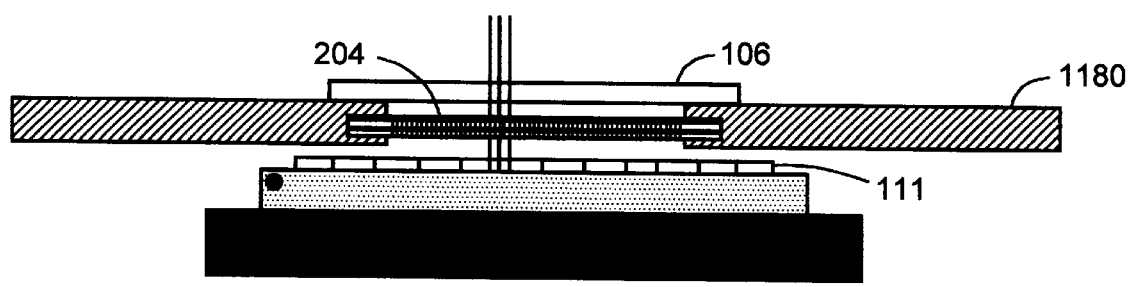
FIG. 11a micro-objective assembly incorporated into a maskholder according to the invention.

FIG. 7 shows a non-hexagonal triangular pattern which may be used in a scanning system of the present invention. The non-hexagonal pattern is characterized by a sequence of "horizontal" rows 600-1, -2, and -3 which are offset in a direction that is perpendicular to the scanning direction. In one embodiment, adjacent lens channels in the same horizontal row are offset from zero to sixty degrees ($\theta$) from the horizon (where zero degrees of offset would result in a completely horizontal row without offset and alternatively, sixty degrees of offset would result in a triangular pattern as is shown in FIG. 6), and preferably between zero and thirty degrees. The use and effectiveness of a non-hexagonal pattern is discussed below with reference to a scanning system and FIGS. 11a, 11b and 11c.

Lenses 400 and 404 may be transparent to ultraviolet light. In one embodiment, the lenses are constructed from quartz (fused silica). Alternatively, a material having a higher refractive index such as epitaxial diamond may be used in order to increase the diffraction limited resolution spot size for a given lens assembly. Epitaxial diamond has a higher refractive index as compared to fused silica. Other high refractive index materials may be used including DPV photoresist part number "2HS" manufactured by Shipley, Inc., Indianapolis, Indiana, having a refractive index of 1.755 (in 365 nm light).

A plurality of micro-optical elements (e.g., lens channels) are arranged in a two dimensional array. A plurality of these two dimensional arrays form micro-objective assembly 204 (FIG.2). The assembly can be realized by stacking finished substrates including the micro-optical elements into a sandwich structure to create the micro-objective assembly.

Figure 8:
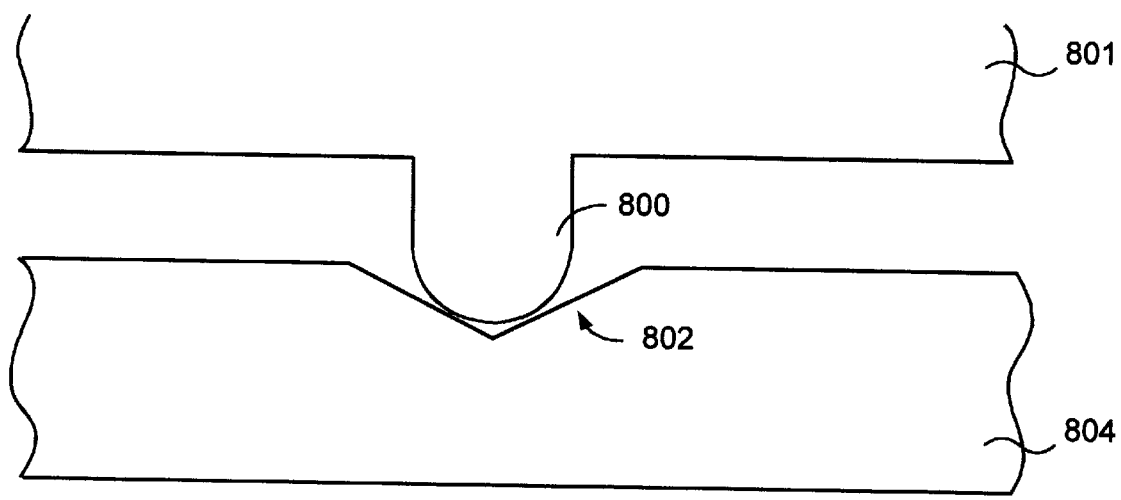
FIG. 8 shows a ball and groove alignment guide for use in aligning lens according to the invention.

The stacking may be accomplished by placing spacers in between the various substrate layers at the desired spacing. Fibers or micromachined precision bearings may be used to act as spacers between the layers. Alternatively, one side of the substrates (typically the back side of a plano-convex structure) may be etched and provided with alignment and spacing guides as is shown in FIG. 8. In particular, a ball 800 may be etched into a bottom layer of one substrate 801 and a matching groove 802 etched into a corresponding upper layer 804 of adjacent substrate. Once aligned, ball 800 and groove 802 provide the appropriate spacing for the substrate layers in the microlens assembly.

Connection of the substrate layers to each other or to the spacer may be accomplished by, for example, cementing, bonding, clamping, local melting or riveting.

Alignment of the substrate layers can be accomplished by using alignment marks or physical means. An apparatus for aligning substrates referred to as a maskaligner may be used.

Alignment of micro-objectives will be discussed in greater detail below with reference to FIG. 9.

Substrate

In operation, the photolithography apparatus of the present invention provides a light field which is passed through an array of optical elements to form at least one image. A uniform plane wave light field is generated at a light source far from the photomask or its optical equivalent, and passes through the photomask modulating the light field to include the pattern information. The light field with the pattern information impressed thereon passes through the micro-objective assembly. Every micro-objective channel forms one image (a partial image). The partial images form a 1:1 copy of the original photomask on the substrate.

An image of the mask features is formed in the photo-sensitive layer of the substrate. Conventional photoresists may be used.

The illumination system may provide polychromatic or monochromatic light to illuminate the photomask depending on system requirements. Variations in the illumination spectra may have significant influence on the image formed on and in substrate 111 (FIG. 1). For example, in a symmetrical imaging system as described above, the image plane changes with wavelength due to material dispersion. The plane of coincidence where the images from adjacent imaging channels correctly overlap is independent of the wavelength. Accordingly, all images generated from one point in the photomask and transported through the micro-objective assembly by different wavelength light overlap correctly in the plane of coincidence. However, for only one wavelength is this equal to the plane of imaging. The other images from different wavelength overlap correctly but their resolution may be reduced at the image plane. Multiple wavelength imaging may be used to print in thick photoresist layers of 10 to 100 micrometers or thicker. The aerial image of the shortest wavelength light, e.g., the I-line image, is located near the top of the resist layer, while the image of the longest wavelength light is located near the bottom of the resist layer. This technique may be used to print multiple images in different planes in the resist and achieve five (5) micron resolution at a depth of focus of between 50 and 100 microns.

Mask to Substrate Alignment

In order to achieve one-to-one imaging of an object, the micro-objective assembly must be aligned and maintained between the object (mask) and the image (to be formed on the substrate). Depth of focus refers to the distance that an image plane may be misaligned (due to improper positioning of the micro-objective assembly, sagging or other defects) relative to the actual imaging surface and yet still produce a desired resolution image on the imaging surface. For proximity printing, the resolution decreases rapidly with distance (in the z-axis in a horizontal imaging system).

Figure 9:
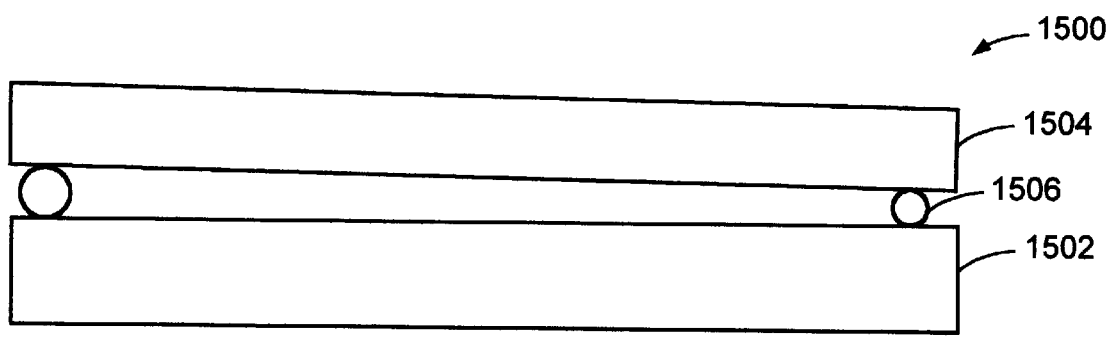
FIG. 9 shows a spherical ball spacing guide for aligning lens layers according to the invention.

One solution for helping to maintain the image plane relative to the object is to provide a mask and lens assembly sandwich structure 1500 as is shown in FIG. 9. The sandwich structure provides a fixed distance between the lens assembly 1502 elements and the photomask 1504. The alignment of such a structure is thereafter simplified requiring the alignment of a single structure (the mask and lens assembly sandwich 1500) as opposed to having to align multiple independent structures. The spacing of the lens assembly and the photomask may be maintained by spacers 1506 dispersed throughout the sandwich structure. Alternatively, back side etching of the devices may be used to create a ball and groove spacing as was described previously. While this combined structure may be costly, due to the attachment of the structure to the photomask itself, the spacing of the printing system from the sandwich (typically 1–5 $\mu$ms) will allow for minimal contact damage during print operations in proximity printing applications.

Alternatively, the micro-objective assembly may be advantageously used in the alignment of the substrate relative to the photomask. Conventional photolithography techniques make use of alignment marks or physical alignment features on the substrate to align the substrate relative to the mask prior to imaging.

Figure 10:
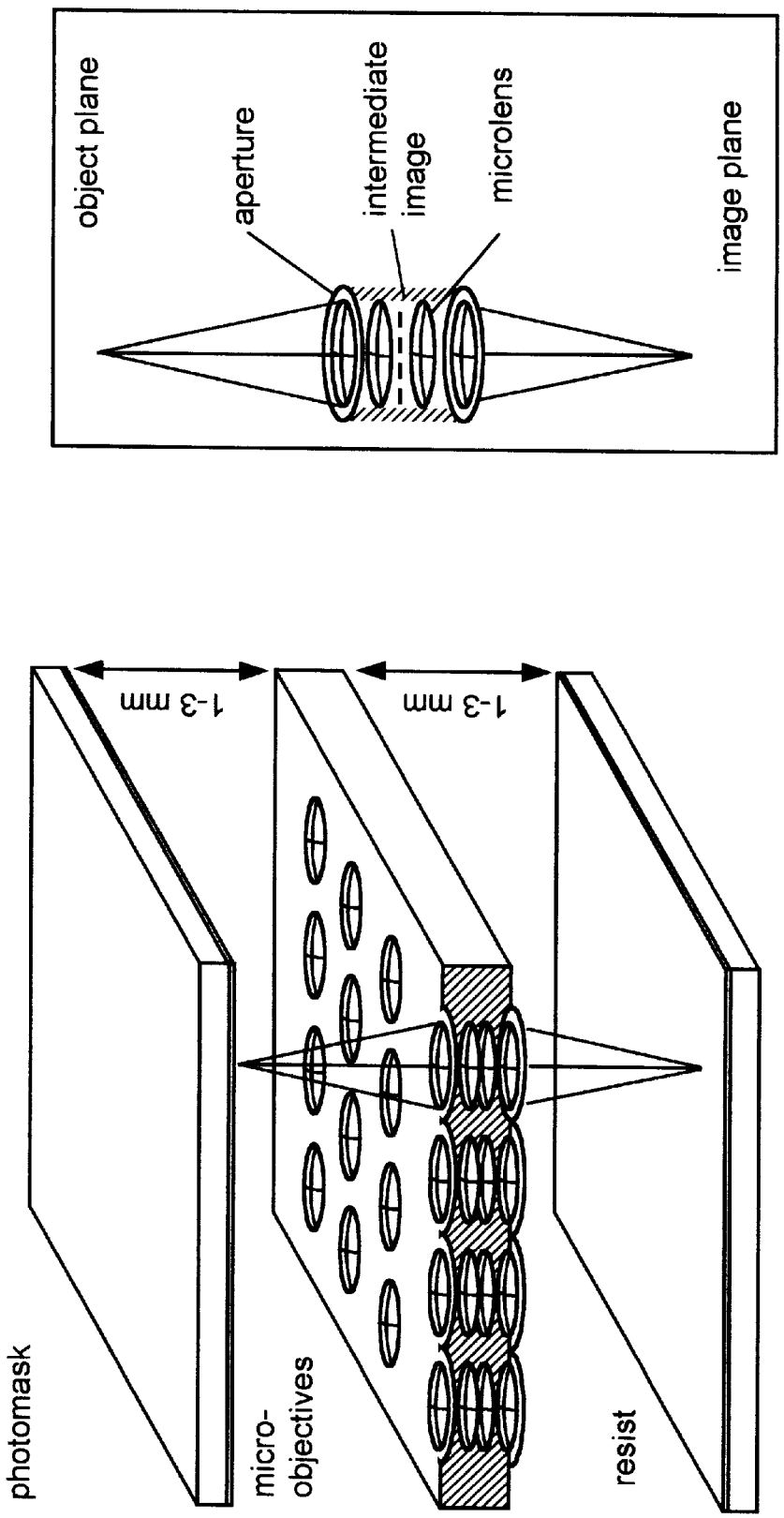
FIG. 10 shows a bi-directional imaging path for an imaging system according to the invention.

The present invention provides a unique capability to allow for the easy alignment of the mask relative to the substrate. Referring now to FIG. 10, systems using micro-objective assemblies provide an optical path that is bi-directional. More specifically, just as the illumination source uses the optical path through each microlens to focus an image at the imaging surface on the substrate, a user may take advantage of the microlens optical path to image an alignment mark located on the surface of the substrate onto the bottom surface of the photomask. Obviously, this alignment technique requires that the lens assembly be capable of passing visible light. The mask to substrate alignment may be performed by an alignment microscope as is used in conjunction with a proximity or contact copying maskaligners.

Movement of the Micro-objective Assembly

The uniformity of the light intensity in the image plane is critical to image resolution. Light is transported from the mask through densely packed imaging channels in the micro-objective assembly to the image plane. The micro-objective assembly structure is also characterized by opaque portions between the channels that do not pass any light. In addition, one of the channels may include defects creating localized areas characterized by non-uniformities. Intensity variations in the image plane result from these non-uniform regions.

In addition, the use of densely packed parallel channels to transport light form the mask to the image plane results in interference effects. Light passes through adjacent image channels in parallel. Interference effects may be generated on the surface at the image plane for partial coherent and incoherent light resulting in a sinusoidal interference patterns in the image plane.

In order to compensate for the non-uniformities in the micro-objective assembly and to superimpose a large number of different images, each with their own interference patterns, the micro-objective assembly may be moved relative to the mask and the substrate.

The micro-objective assembly may be moved horizontally (perpendicular to the light for a vertical system) along a path resulting in the effective elimination of interference and defect effects by averaging out the defects of the particular imaging system. The light intensity across the image field is homogenized by the movement. The movement must be precise in that parallelity and distance from the mask and the substrate must be maintained.

Figure 11B:
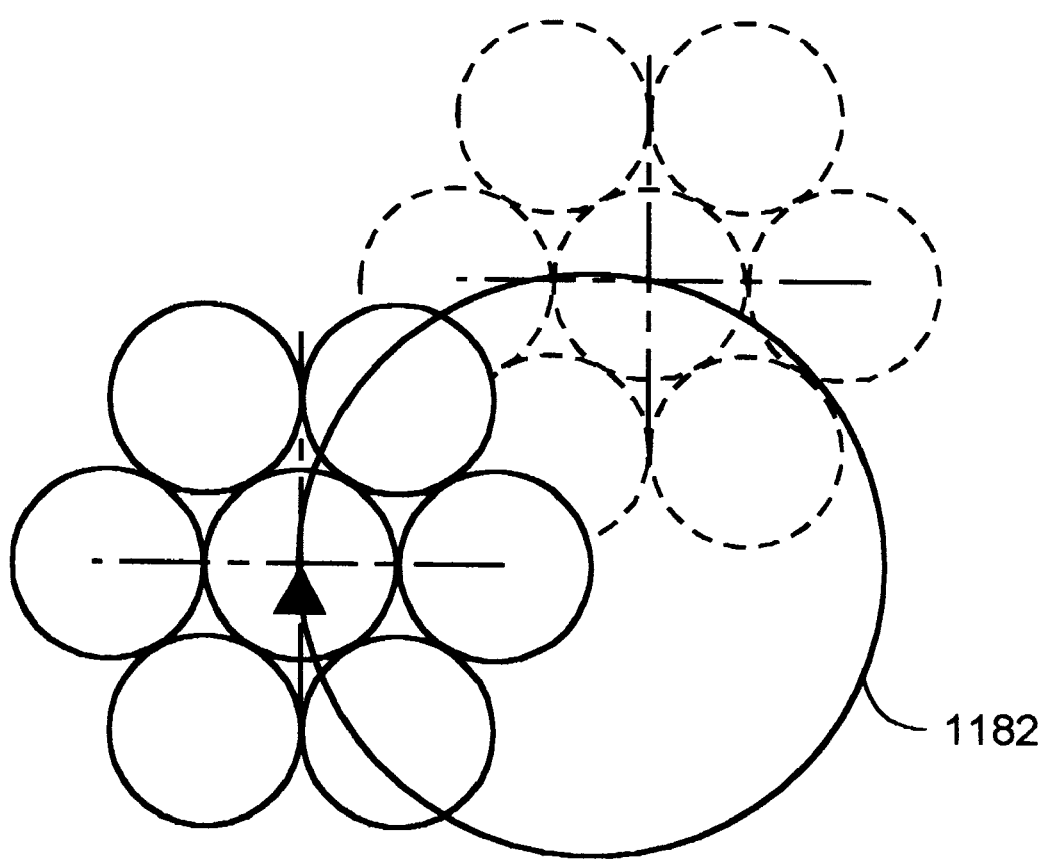
FIG. 11b shows a motion path for the movement of a micro-objective assembly according to the invention.
Figure 11C:
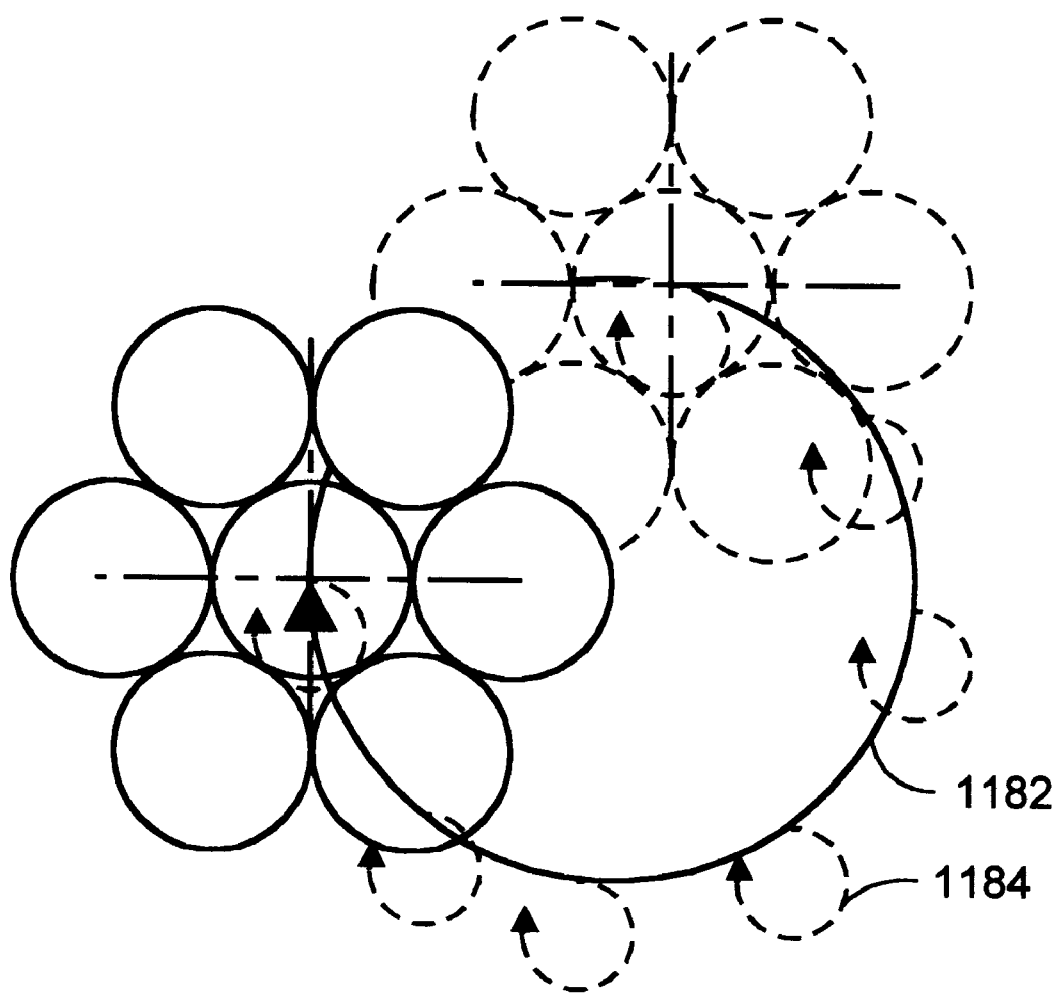
FIG. 11c shows a complex motion path for movement of a micro-objective assembly according to the invention.

Referring now to FIG. 11b, the micro-objective assembly may be moved along a first circular path 1182 having a radius of several to a few lens diameters. The minimum diameter for the first circular path is a few lens diameters to compensate for defective lens conditions. Larger paths may be used in order to simplify the mechanical requirements associated with moving the micro-objective lens assembly. A second circular motion 1184 may be applied to the micro-objective assembly to move the first circular path so as to assure that the center of any lens covers the entire motion area defined by the first circular path.

Alternatively, the micro-objective assembly may be incorporated into a scanning system in which the micro-objective assembly is scanned over the print/image area. Scanning helps to average out the effects of missing or damaged lenses. Defects in one or more of the lenses in a line of lenses that passes an image in a scanning system have a diminished effect in the outcome of the resultant image projected onto the substrate due to the greater number of non-defective lenses in the line that also pass the image. Scanning tends to minimize and average out the loss or scattering of light due to these localized flaws in the lens assembly. Again, the movement of the micro-objective assembly along the path in the scanning system provides for uniform illumination in the image plane. Scanning systems are discussed in greater detail below with reference to FIGS. 13a–c.

Applications

One use of the system is the production of flat panel displays. While the present discussion will focus on the production of flat panel displays, the teaching of the present invention may be advantageously used to produced a variety of microdevices. The production of flat panel displays has conventionally required the use of a stepper, where multiple exposures over large areas are realized in order to produce the finished device. Severe limitations exist in the through-put and yield of such systems. To avoid such limitations, a large area tool as described above and as was disclosed in co-pending application entitled "Lens Array Photolithography", U.S. Ser. No. 08/593,042 filed Jan. 29, 1996, the entirety of which is expressly incorporated herein by reference, may be advantageously used.

Conventional production techniques for a flat panel display include multiple steps (exposures) of the substrate. A large area tool as constructed in accordance with the teachings disclosed above which includes a large area micro-objective assembly will resolve many of the limitations involving the use of conventional steppers.

However, limitations exist in the use of very large micro-objective assemblies. First, most conventional imaging systems are oriented horizontally, that is, the imaging plane is horizontal and all lens elements are in a horizontal position. Accordingly, as the size of any lens element grows, gravity effects produce sagging in the lens element. Imaging characteristics of the system are dependent on the relative spacing between lenses, the object and the image. Sagging degrades image resolution over the entire surface area.

Vertical Imaging Systems

Figure 12:
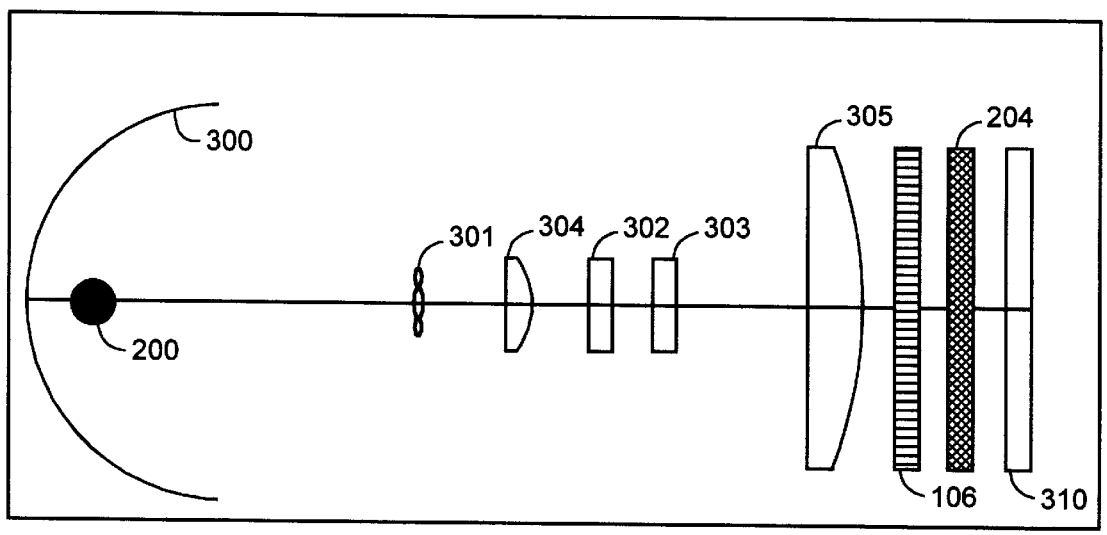
FIG. 12 shows a vertical imaging system according to the invention.

In order to minimize the effects of gravity, the micro-objective assembly imaging system described above may be incorporated into a large tool vertical imaging system. Referring to FIG. 12, a vertical imaging system in which the lens are stacked vertically is shown. By providing vertical imaging, the effects of gravity on a lens element is effectively removed. An alternative vertical exposure tool for use in a scanning system is described below in conjunction with FIGS. 13a, 13b and 13c.

Scanning System

While vertical systems reduce the effects of gravity on the micro-objective assembly (lens array), a very large micro-objective assembly is difficult and costly to produce. This is due in part to the micro-lithography techniques required to produce the lens assembly itself. The size of the micro-objective assembly may be minimized by integrating the micro-objective assembly into a scanning system. In a scanning system, the lens assembly portion of the imaging system covers only a small part of a larger mask/print area. The smaller lens assembly is accordingly required to be moved over the whole print area. Scanning systems also advantageously provide uniform illumination at the image plane. There are a number of methods for exposing the larger mask print area, two of which are: scan the micro-objective assembly relative to a fixed light source, wafer and substrate; scan the mask and wafer simultaneously by the light source and micro-objective lens assembly.

While the technique commonly employed in the semiconductor industry in scanning systems is to employ the latter of the two methods, the characteristics of the micro-objective assembly make the former a better solution. The micro-objective assembly is typically on the order of magnitude of two to three times lighter in weight than the projection (illumination) system. Accordingly, a scanning system in which only the micro-objective assembly moves may be preferable.

Figure 13A:
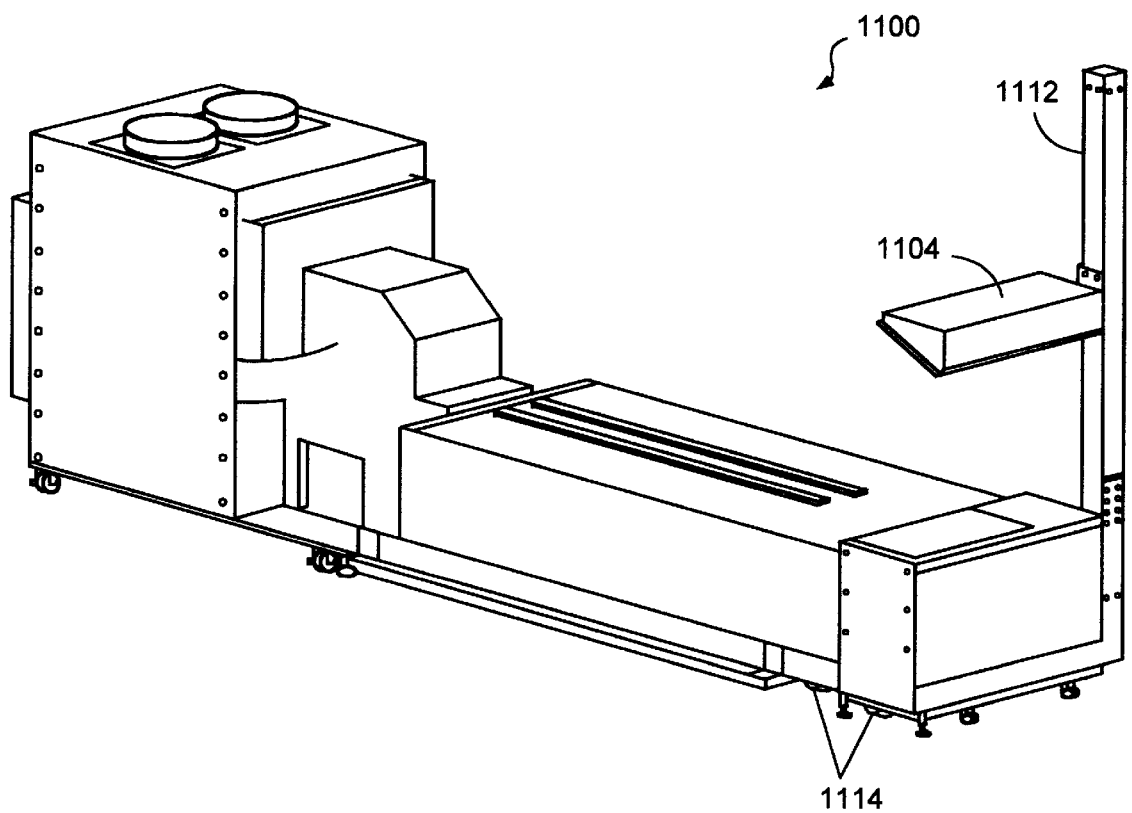
FIGS. 13a–b show a scanning system according to the invention.
Figure 13B:
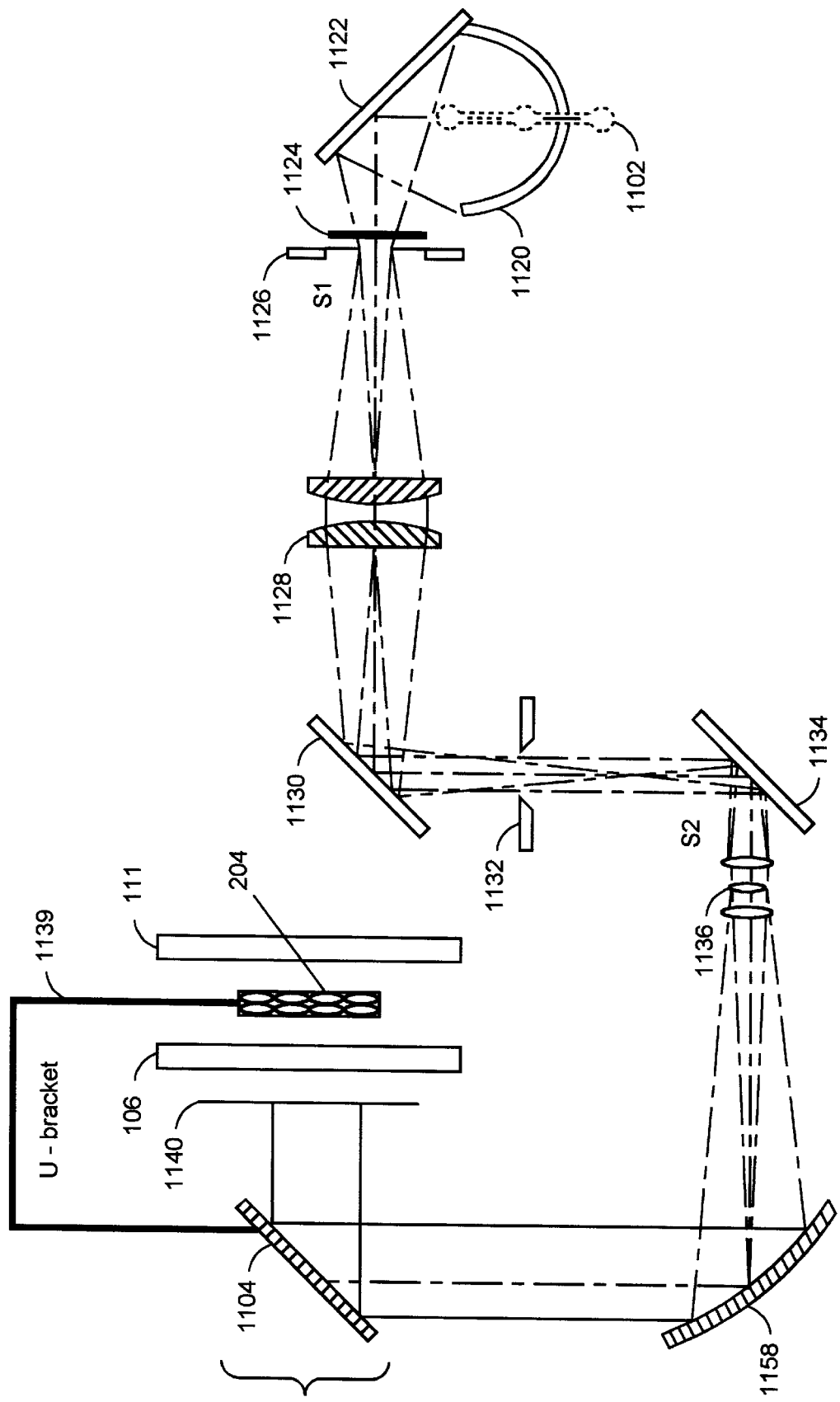
Figure 13C:
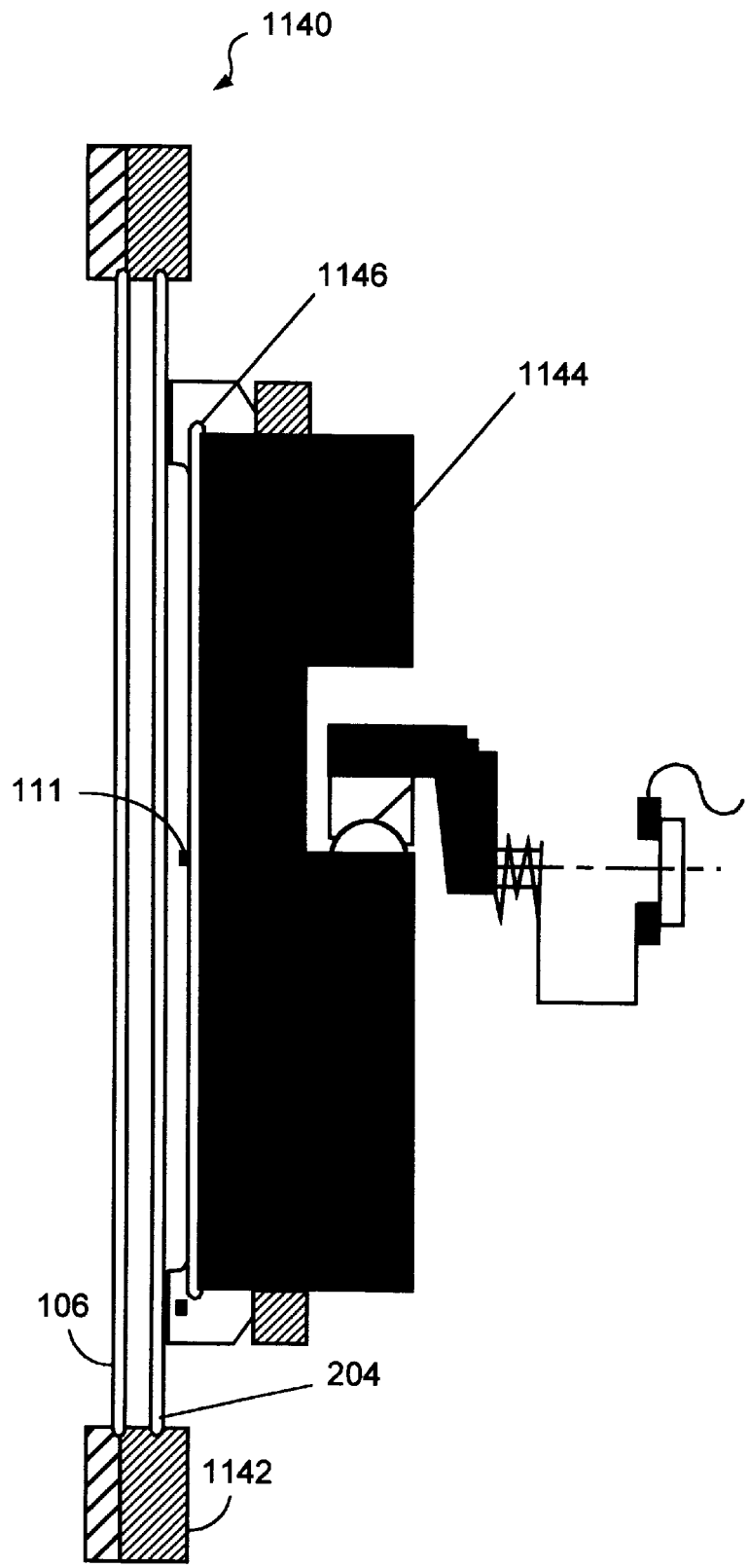
FIG. 13c shows an alternative scanning system according to the invention.

Referring now to FIGS. 13a, 13b and 13c, a scanning system 1100 is shown including source 1102, a scanning mirror 1104 and lens assembly 1106 disposed between a photomask 1108 and substrate 1110. Associated with scanning mirror 1104 is a motor (not shown) for moving scanning mirror 1104 along a vertical column 1112 in one axis (z-axis) relative to the substrate.

An exposure tool 1114 includes source 1102, elliptic reflector 1120, cold mirror 1122, shutter 1124, iris 1126, condenser 1128, folding mirror 1130, iris 1132, second folding mirror 1134, fly eye 1136 and parabolic mirror 1138. In one embodiment, exposure tool 1114 is an exposure tool from an MA-500 stepper produced by Karl Suss KG GmbH & Co, Garching, Germany.

In operation a plurality of enlarged light source images are presented to parabolic mirror 1138 which in provides an illumination pattern to scanning mirror 1104 for transfer to an exposure plane 1140. Scanning mirror 1104 moves in the z-axis to produce an illumination pattern over a varied area in exposure plane 1140.

Generally located at exposure plane 1140 are photomask 1108, lens assembly 1106 and substrate 1110. FIG. 13b includes a moving micro-objective assembly 204 coupled by a generally U-shaped bracket 1139 to scanning mirror 1104. In this configuration, a small micro-objective assembly may be used to image over a larger area substrate 111. The micro-objective assembly may be sized to be same size or larger than the illumination pattern provided by the scanning mirror. A smaller micro-objective assembly may be easier and more economical to produce. In operation, the micro-objective assembly and light source move in unison over the substrate illuminating various portions of the substrate by modulating light from the light source through the photomask for imaging on the surface of the substrate.

Alternatively, micro-objective assembly 204 may be stationary. In this configuration (as is shown in FIG. 13c), a mask 106 and micro-objective assembly 204 are aligned vertically in a fixed position by mask fixture 1142. Substrate 111 may be held between chuck 1144 and micro-objective assembly 106 by substrate fixture 1146. Retractable balls (not shown) are inserted between the lens assembly and the substrate to provide horizontal alignment of the substrate. Sensors (not shown) measure the force with which the retractable balls contact the lens assembly and the substrate, the output of which are feed back to control circuit (not shown) to control the movement of chuck 1144.

Scanning provides a number of benefits in the photolithography system. First, scanning systems provide uniform time integrated intensity of exposure across the substrate being imaged. Light sources with limited field can be used in the scanning system without markedly diminishing system thru-put. In addition, while the scanning system disclosed herein is a vertical system, scanning can also be beneficially used with a horizontal system. In a horizontal system, scanning allows for the use of smaller microobjective assemblies that are not subject to distortions due to gravity effects.

Tiling Systems

Another method for reducing the size of the lens assembly required to image a large area is referred to as tiling. Tiling involves piecing together a series of microlenses in a pattern designed to image a large area. Individual lenses are relatively small, easily produced and do not suffer from sagging effects described above for typical horizontal systems. The tiles may be joined by mounting to a common transparent substrate (transparent to UV). However, the thickness of this substrate can not be larger than the photomask-to-lens assembly or lens assembly-to-substrate spacing (distance). In a typical system this spacing is on the order of magnitude of 1 mm to 5 mm with 2.5 mm used in a six inch imaging system. The larger the tiled array, the thicker the transparent substrate required to provide the mechanical stability necessary to meet the demands of a typical horizontal implementation.

Figure 14:
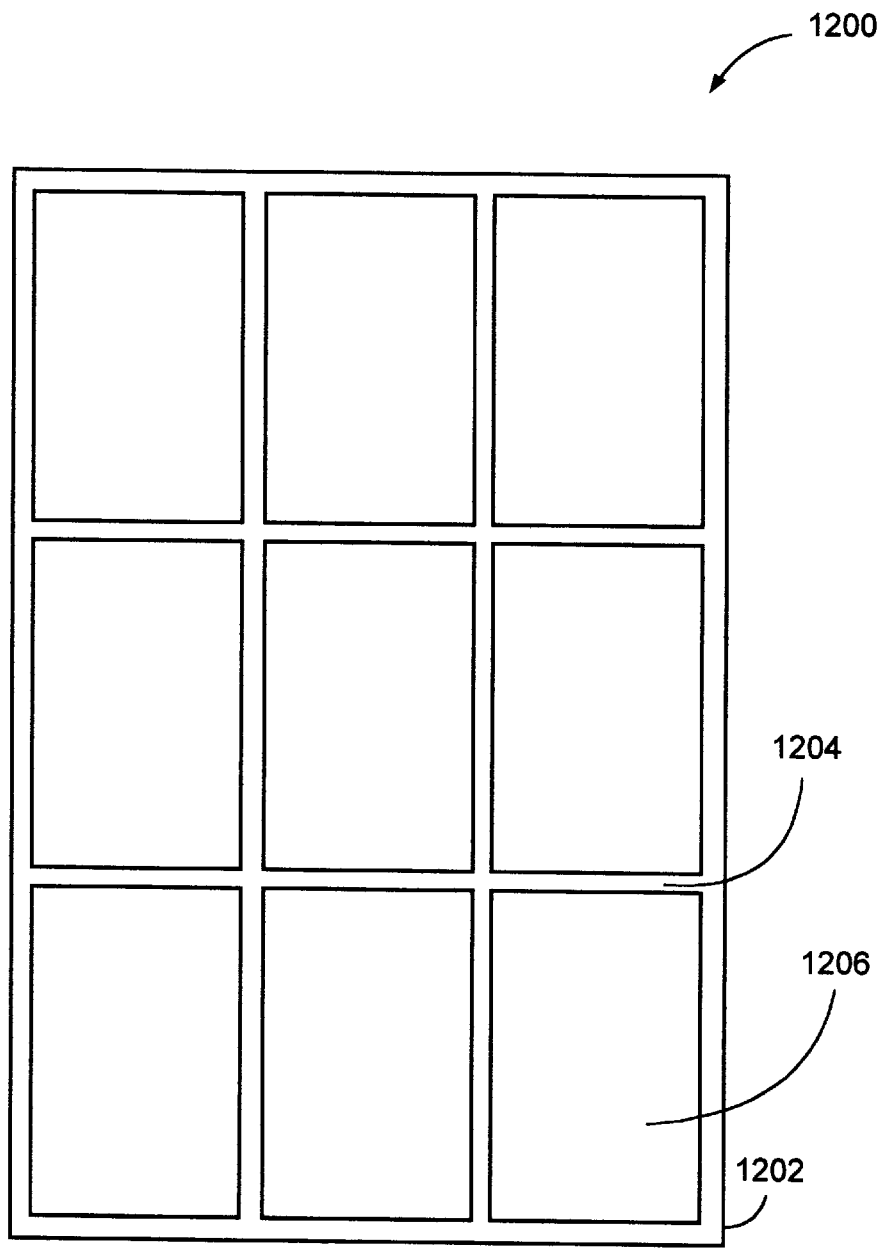
FIG. 14 shows a tile according to the invention.

Referring now to FIG. 14, a mechanically rigid structural member 1202 may be employed along the border of the tile array 1200. A bonding agent 1204 may be used to create a structure similar to leaded stained glass for joining individual tiles 1206. Alternatively, glue, mechanical holders, welding or other means may be used to join the individual tiles.

Tiling presents one problem in imaging objects, namely border regions. The border between tiles is a region in which light scattering or blockage may occur. Accordingly, object regions directly corresponding to such defect regions may not be imaged correctly onto the substrate. Ideally tiles may be produced that have an edge that terminates perfectly at the edge of a series of lens channels. The series of lens channels ideally would form a row located in close proximity to the edge of the tile to provide for imaging over the entire surface thereof. Unfortunately, the spatial geometry of the lenses (packed hexagonal) and imaging techniques do not provide such a luxury. Typically, the edge region about the periphery of the tile includes a plurality of partial lenses which may block or scatter light and effect overall imaging in the local area. In addition, joints between the region may include other materials (such as may be required to be used in the stain glass support structure described above) resulting in a larger defective region. The present invention provides a plurality of methods for minimizing or averaging the effects of these defect regions while still maintaining the capability to image over large areas.

1. Scanning Systems.

As was described above in relation to localized defects in a lens assembly, a scanning system can be used to minimize defects attributable to the tiling joints. In particular, the tiles may be laid in an orientation relative to the scan to minimize the effect of such joint lines.

Figure 15:
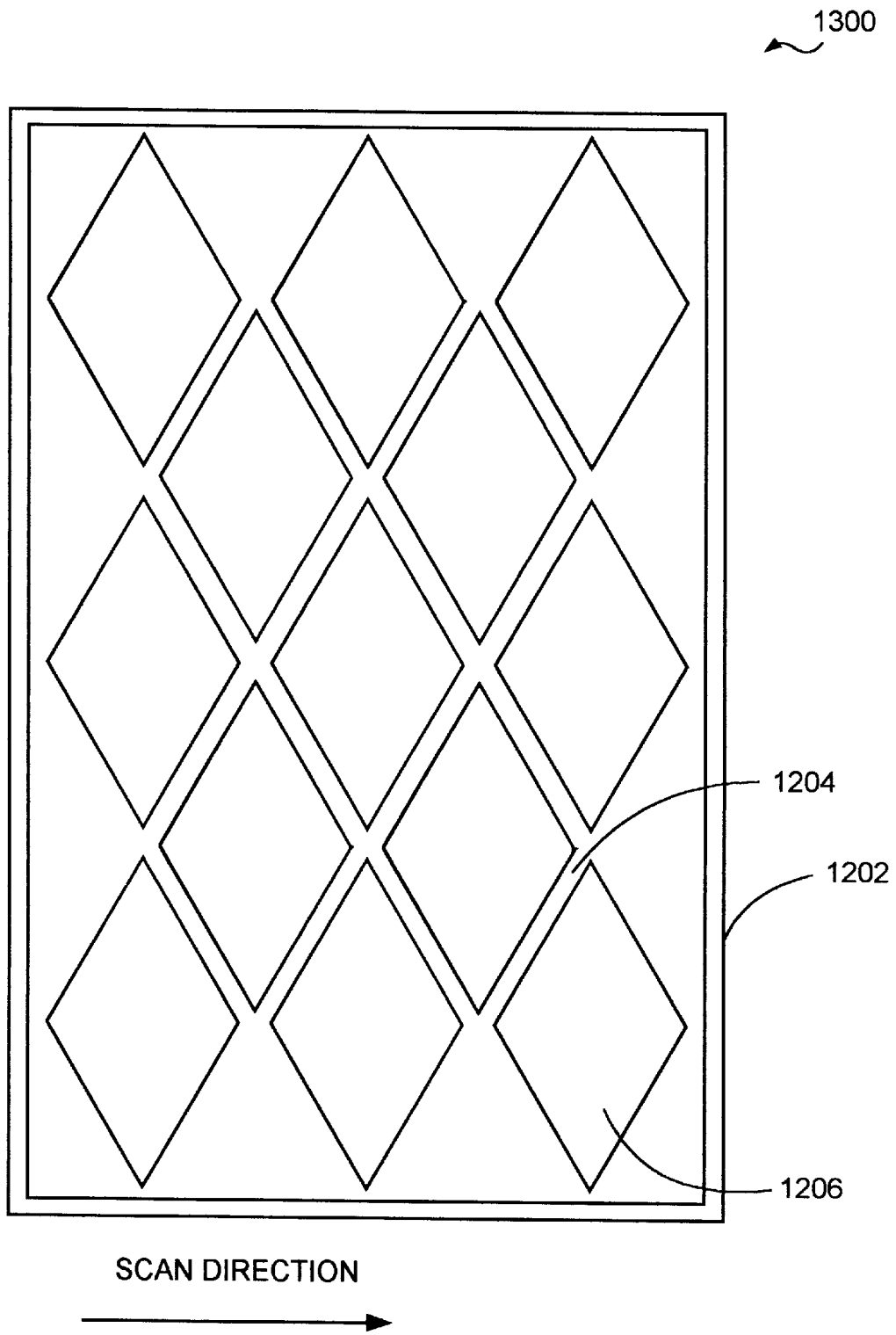
FIG. 15 shows an alternative tile layout according to the invention.

Referring now to FIG. 15, a tiling arrangement 1400 for a large area scan is shown. Ideally, the tiles are arranged such that tile borders do not lie in the direction of the scan. The argyle-patch layout eliminates the occurrence of defective regions in the imaged substrate.

Tiling may be advantageously used along with a scanning mechanism to create a large area image. In this embodiment, the lens assembly is tiled in a fashion similar to that shown in FIG. 15. The lens assembly is moved along with the illumination source resulting in the averaging of defects due to t he edge (joints) in the tile array.

2. Movement of the Tile Array.

Another method of reducing the effects of joints in the tile is by moving the tile array to effectively blur the joints between them. As was described in th e previous paragraph, th e effect of moving the tile, relative to the imaging surface (the substrate) results in an averaging of the effects attributable to any defect. Rather than scanning the entire tile over the area to be imaged, a larger tile may be used as long as the larger tile is moved to compensate for the joint regions. The movement of the tile may be in one direction or two (one or two dimensional oscillation) to provide x and y axis rotation (assuming a horizontal imaging system). The rotation is perpendicular to any tile joint located in the tile array. Accordingly, for a one dimensional tile array, movement of the array is required in one direction. Typically, two dimensional arrays are to be used in large area imaging and a two dimensional movement is required. In a two dimensional tile array, the oscillation pattern preferably is in a cycloid path.

Figure 16:
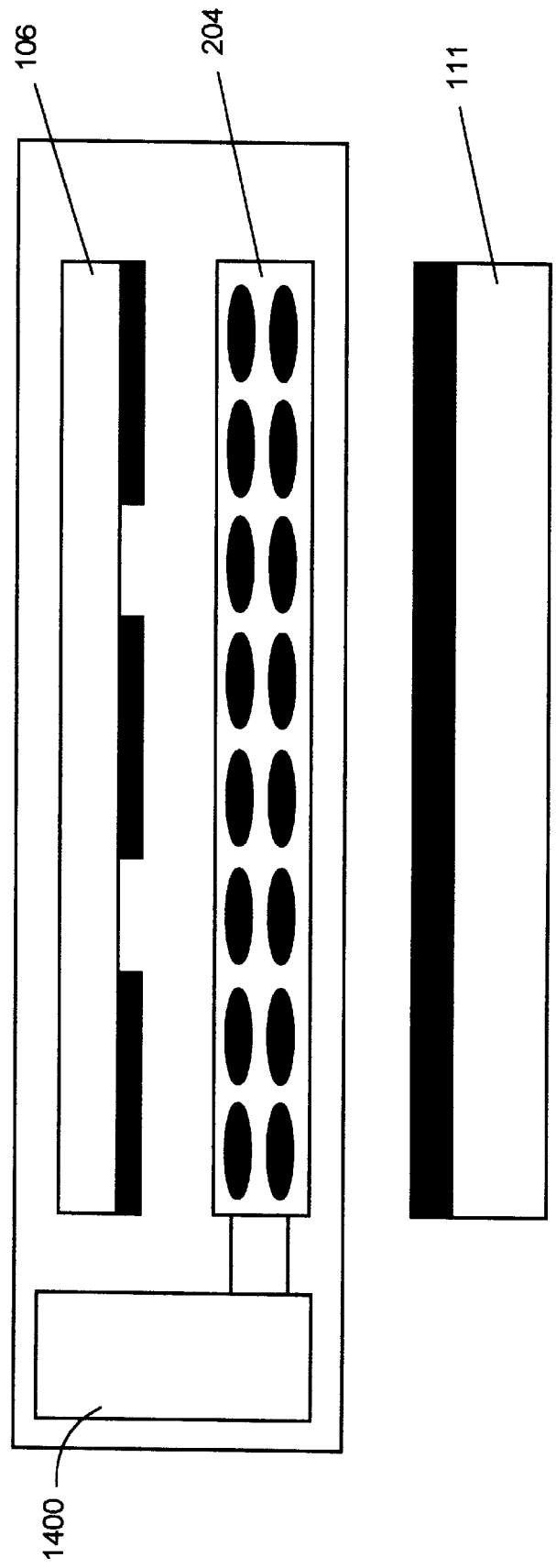
FIG. 16 shows an oscillation system according to the invention.

Referring now to FIG. 16, an actuator 1400 is provided coupled to the tile lens assembly 1402 for rotating the array in two dimensions. The actuator may be a piezo electric motor or other actuator means may be employed. The effect of time averaging is proportional to the distance the tile array moves and the amount of time the tile array spends in any particular location. The greater the movement, the greater the averaging up to the distance of the tile width. For best results, the minimum distance the tile should be moved in any dimension of concern is several times the width of the border region (joint) attempting to be averaged.

The present invention has been described in terms of specific embodiments, which are illustrative of the invention and not to be construed as limiting. Other embodiments are within the scope of the following claims.

What is claimed is:

1. An apparatus for photolithographic exposure of a substrate comprising:

an illumination source for providing light for producing an image on the substrate;

a mask including a pattern for projection onto the substrate;

a lens assembly disposed between the mask and the substrate and including a plurality of parallel lens channels, the lens assembly projecting the light concurrently through the plurality of parallel lens channels onto the substrate; and an actuator for moving the lens assembly in a plane parallel to the mask and the substrate for suppressing interference effects.

2. The apparatus of claim 1 wherein the actuator moves the lens assembly along a first motion path that defines a circle.

3. The apparatus of claim 2 wherein the circle has a radius of a few lens diameters.

4. The apparatus of claim 2 wherein the actuator moves the lens assembly along a second motion path while generally traversing the first motion path and wherein the second motion path defines a second circle of a smaller radius.

5. The apparatus of claim 1 wherein the lens assembly includes a plurality of tiles.

6. The apparatus of claim 5 wherein the tiles are arranged to form a patterned sheet.

7. The apparatus of claim 5 wherein the patterned sheet includes joint regions disposed between tiles.

8. The apparatus of claim 7 wherein the patterned sheet is scanned to eliminate defects associated with an individual tile or joint region.

9. The apparatus of claim 7 wherein the patterned sheet is moved relative to the substrate to eliminate defects associated with an individual tile or joint region.

10. The apparatus of claim 1 wherein the lens assembly includes bi-directional lens channels for projecting an image from a surface of the substrate back to a surface of the mask to align the mask and substrate.

11. The apparatus of claim 1 wherein the light is poly-chromatic light.

12. The apparatus of claim 11 wherein components of the poly-chromatic light produce images at different depths in the substrate.

13. The apparatus of claim 1 further including a scanning mirror for reflecting light from the illumination source onto a portion of a surface of the substrate, the scanning mirror operable to move parallel to the imaging surface to allow for the illumination of the entire substrate surface.

14. The apparatus of claim 13 wherein the lens assembly is attached to the scanning mirror such that as a combination of the lens assembly and scanning mirror are moved, interference effects generated on the imaging surface are averaged.

15. The apparatus of claim 13 wherein the substrate being of a first size and having a first length and first breadth and wherein the lens assembly being fixed with the mask and of a second size and having a second length and a second breadth and wherein the second length and the second breadth are equal to or greater than the first length and the first breadth, respectively.

16. An apparatus for photolithographic exposure of a substrate comprising:

an illumination source for providing light for producing an image on the substrate;

a mask including a pattern for projection onto the substrate;

a lens assembly disposed between the mask and the substrate and including a plurality of parallel lens channels, the lens assembly projecting the light concurrently through the plurality of parallel lens channels onto the substrate; and a scanning mirror for reflecting light from the illumination source onto a portion of a surface of the substrate, the scanning mirror operable to move parallel to the imaging surface to allow for the illumination of the entire substrate surface.

17. The apparatus of claim 16 wherein the lens assembly is attached to the scanning mirror such that as a combination of the lens assembly and scanning mirror are moved, interference effects generated on the imaging surface are averaged.

18. The apparatus of claim 16 wherein the substrate being of a first size and having a first length and first breadth and wherein the lens assembly being fixed with the mask and of a second size and having a second length and a second breadth and wherein the second length and the second breadth are equal to or greater than the first length and the first breadth, respectively.

* * * * *